(12) United States Patent
Arnold

(10) Patent No.: US 10,700,720 B2
(45) Date of Patent: Jun. 30, 2020

(54) WIRELESS TRANSMITTER, A CIRCUIT, AND METHOD FOR DRIVER HARMONIC REDUCTION

(71) Applicant: NXP B.V.

(72) Inventor: Siegfried Arnold, Sankt Ruprecht an der Raab (AT)

(73) Assignee: NXP B.V., Eindhoven (NL)

( * ) Notice: Subject to any disclaimer, the term of this patent is extended or adjusted under 35 U.S.C. 154(b) by 5 days.

(21) Appl. No.: 15/848,213

(22) Filed: Dec. 20, 2017

(65) Prior Publication Data

US 2018/0183469 A1 Jun. 28, 2018

(30) Foreign Application Priority Data

Dec. 23, 2016 (EP) .................................. 16206693

(51) Int. Cl.
*H04B 1/04* (2006.01)
*H03F 1/32* (2006.01)
*H03F 3/24* (2006.01)
*B60R 25/24* (2013.01)

(52) U.S. Cl.
CPC ......... *H04B 1/0475* (2013.01); *H03F 1/3247* (2013.01); *H03F 3/24* (2013.01); *B60R 25/24* (2013.01); *H03F 2200/451* (2013.01); *H04B 2001/0433* (2013.01)

(58) Field of Classification Search
CPC combination set(s) only.
See application file for complete search history.

(56) References Cited

U.S. PATENT DOCUMENTS

| 6,493,400 | B1 * | 12/2002 | Greeley | H03F 1/3247 375/297 |
|---|---|---|---|---|
| 6,731,915 | B1 | 5/2004 | Tran et al. | |
| 7,729,431 | B2 | 6/2010 | Gebara et al. | |
| 7,809,094 | B2 | 10/2010 | Xu et al. | |
| 2010/0048146 | A1 * | 2/2010 | McCallister | H04B 1/525 455/78 |
| 2013/0200948 | A1 * | 8/2013 | Lee | H03F 1/3247 330/10 |
| 2014/0161005 | A1 * | 6/2014 | Laurent-Michel | H04B 17/21 370/281 |
| 2015/0256216 | A1 * | 9/2015 | Ding | H04B 1/62 375/297 |

FOREIGN PATENT DOCUMENTS

EP 2 983 454 A1 2/2016

* cited by examiner

*Primary Examiner* — Zhitong Chen
(74) *Attorney, Agent, or Firm* — Rajeev Madnawat

(57) ABSTRACT

A wireless transmitter is disclosed. The wireless transmitter includes a digital signal generator arranged to generate a digital signal for transmission, a digital-to-analog converter arranged to convert the digital signal for transmission into analog form and a non-ideal amplifier arranged to amplify the analog signal for transmission. At least one harmonic reduction signal generator is arranged to generate at least one digital harmonic reduction signal and a summing junction is arranged to add the digital signal for transmission with the at least one harmonic reduction signal to form a combined signal. The non-ideal amplifier amplifies the combined signal to form an analog output signal. A controller is coupled to the digital signal generator and the at least one harmonic reduction signal generator.

13 Claims, 3 Drawing Sheets

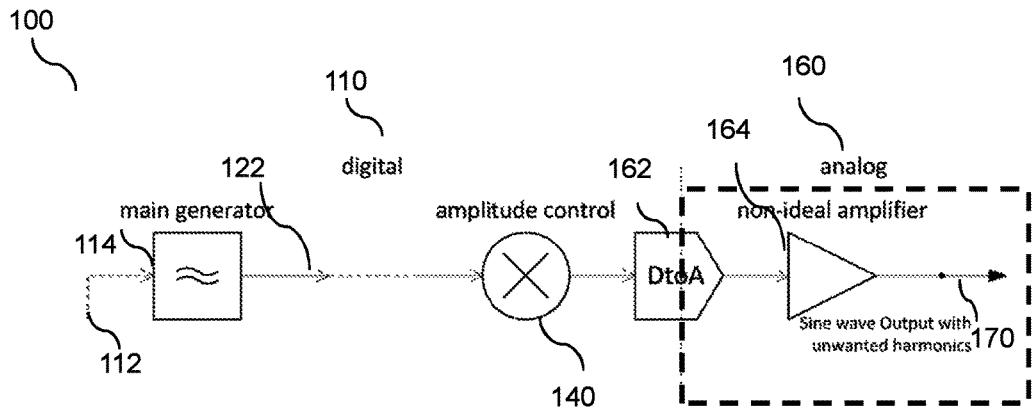
FIG. 1 – Prior Art
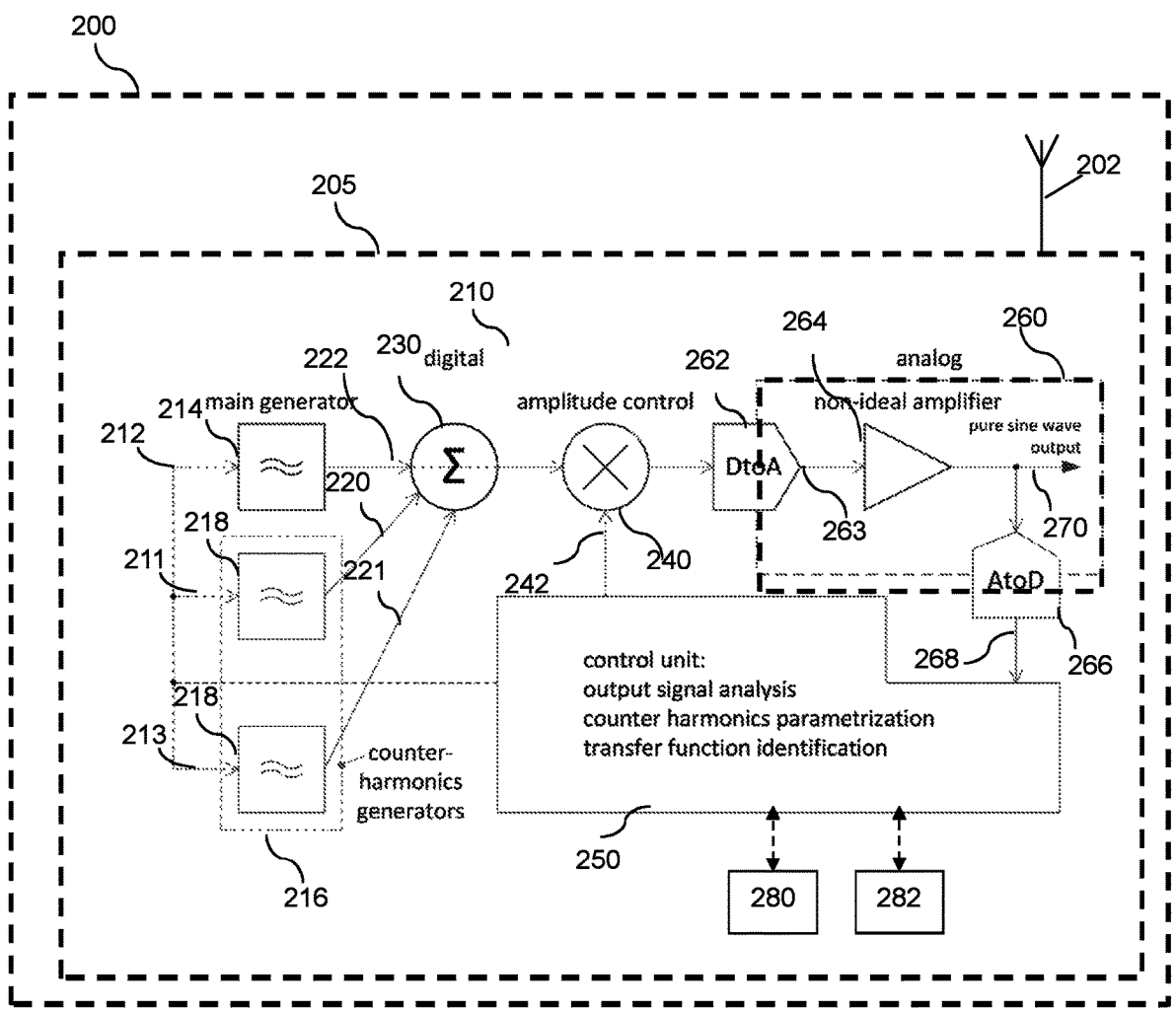
FIG. 2

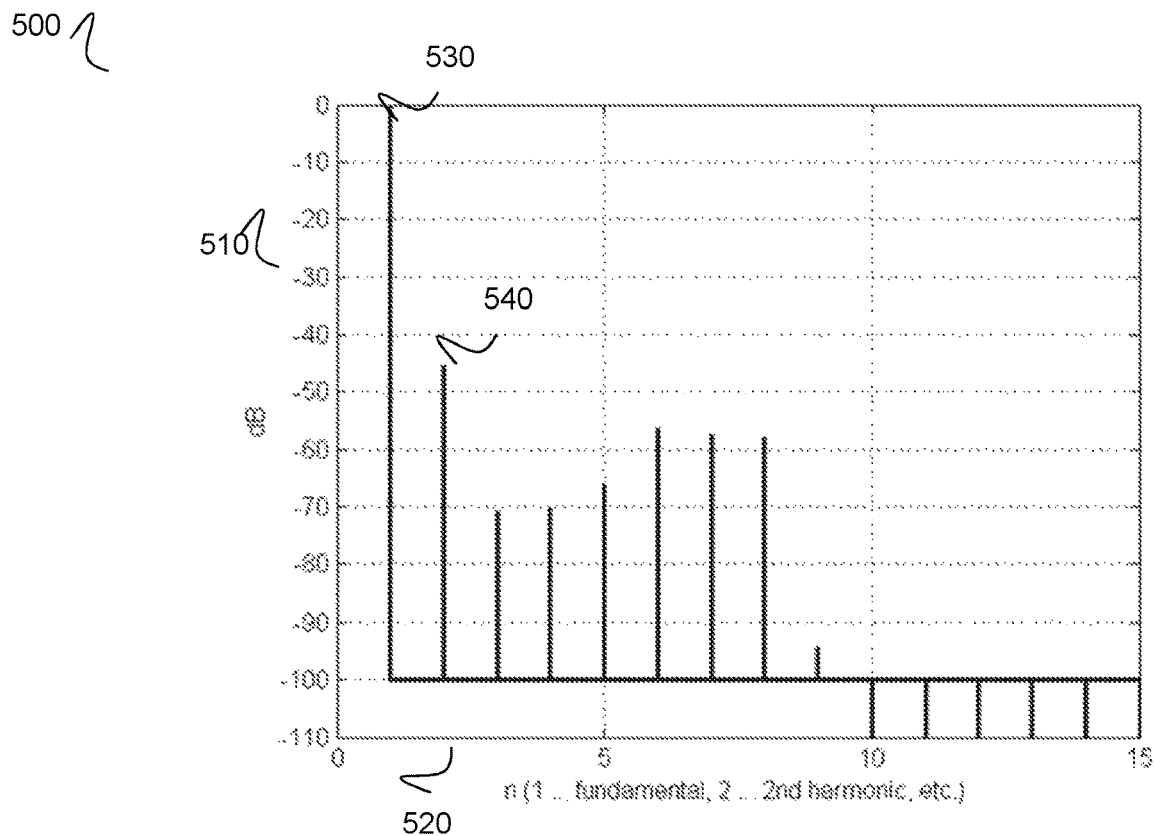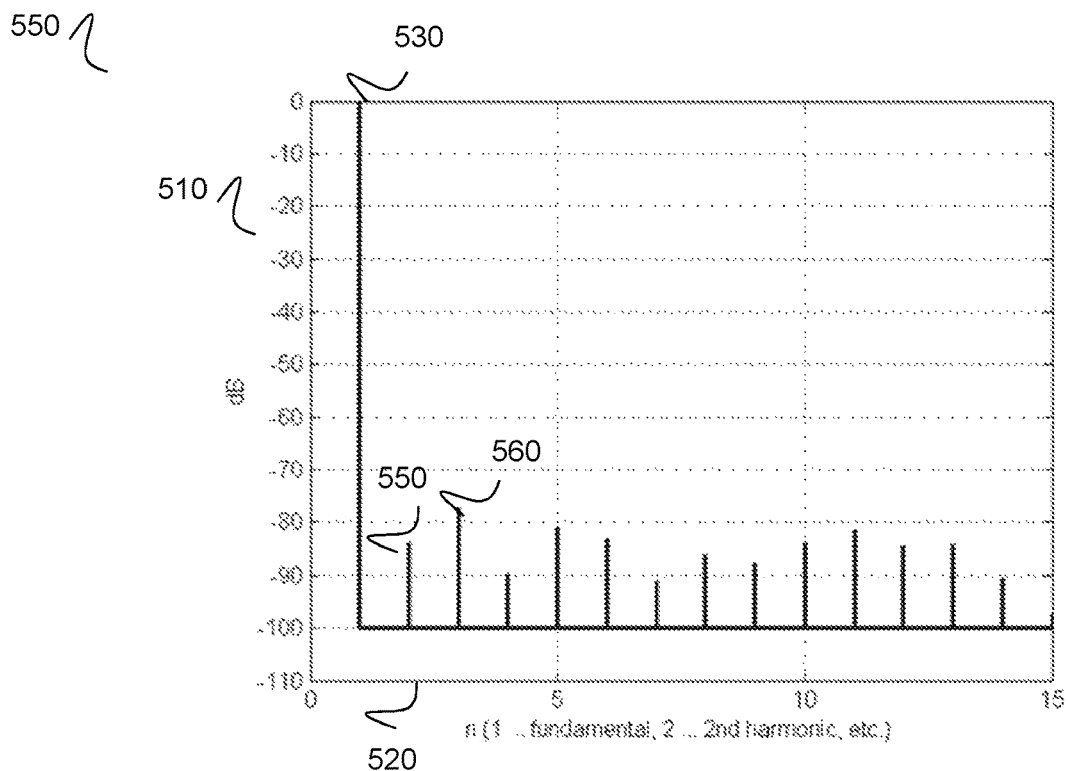
FIG. 5

WIRELESS TRANSMITTER, A CIRCUIT, AND METHOD FOR DRIVER HARMONIC REDUCTION

CROSS-REFERENCE TO RELATED APPLICATIONS

This application claims the priority under 35 U.S.C. § 119 of European Patent application no. 16206693.0, filed on Dec. 23, 2016, the contents of which are incorporated by reference herein.

FIELD OF THE INVENTION

The field of this invention relates to a wireless transmitter and a method for harmonic reduction. The invention is applicable to, but not limited to, a wireless transmitter, such as a passive keyless entry (PKE) base station, that enables harmonic distortion created by a driver amplifier in the PKE base station to be reduced.

BACKGROUND OF THE INVENTION

Passive keyless entry is a generic term for an automotive technology that allows a vehicle driver to lock and unlock a vehicle without using the corresponding SmartKey buttons. Once a driver enters a vehicle with an equipped Keyless Go SmartKey or Keyless Go wallet size card, they have the ability to start and stop the engine, without inserting the SmartKey (i.e. ignition key). A transponder built within the SmartKey allows the vehicle to identify a driver. In some cases, an additional safety feature is integrated into the vehicle, making it impossible to lock a SmartKey that has a Keyless Go feature inside a vehicle. After a few years on the market, this technology is being used ever more extensively, evolving down from luxury car manufacturers to some economy car brands.

FIG. 1 illustrates a simplified example block diagram of a known base station 100 for a passive keyless entry (PKE) system. The base station incorporates circuitry in both a digital domain 110 and an analog domain 160. The base station includes a control input signal 112 that is input to a signal (sine wave) generator 114. The signal (sine wave) generator 114 produces the basic shape of the carrier signal that is directly input into the multiplier 140. The generated carrier signal is a 125 KHz digital output signal 122. The multiplier 140 facilitates setting the desired output (power) level as well as also allowing amplitude modulation of the carrier to be applied. The multiplied (modulated) 125 KHz digital output signal 122 is then converted to an analog signal in digital to analog converter (DAC) 162. The 125 KHz analog output signal is amplified in a non-ideal amplifier 164 to produce an output signal 170.

In a PKE system, there exists a spectral noise requirement for the PKE antenna coil driver application to keep harmonics of the 125 kHz driver signal 80 dB below the main carrier signal. This requirement is particularly relevant to those harmonics that fall into the AM radio band (530 KHz-1710 KHz). With the currently available CMOS technologies, and with the currently available circuit techniques, it is not possible to build an amplifier that exhibits such extreme low-level distortion/harmonics in the output signal 170. Thus, in known base stations for PKE systems, the output signal 170 is a sine wave with relatively high, undesirable levels of harmonic content.

Thus, a need exists for a wireless transmitter, for example as used in a passive keyless entry (PKE) base station, a circuit and a method to reduce harmonic content in order to meet a spectral noise requirement.

SUMMARY OF THE INVENTION

The present invention provides a wireless transmitter, for example a base station for a secure vehicle access system, a circuit and a method to reduce harmonic content therefor, as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like, or functionally similar, elements. Elements in the figures are illustrated for simplicity and clarity purposes only and have not necessarily been drawn to scale.

FIG. 1 illustrates a simplified example block diagram of a known base station for a passive keyless entry (PKE) system.

FIG. 2 illustrates an example block diagram of a wireless transmitter, such as a base station for a passive keyless entry (PKE) system, according to example embodiments of the invention.

FIG. 5 illustrates a sequence of spectra for a typical application illustrating the distortion performance of a known base station and one for a wireless transmitter, such as a PKE base station adapted according to example embodiments of the invention.

DETAILED DESCRIPTION

Figure 3:
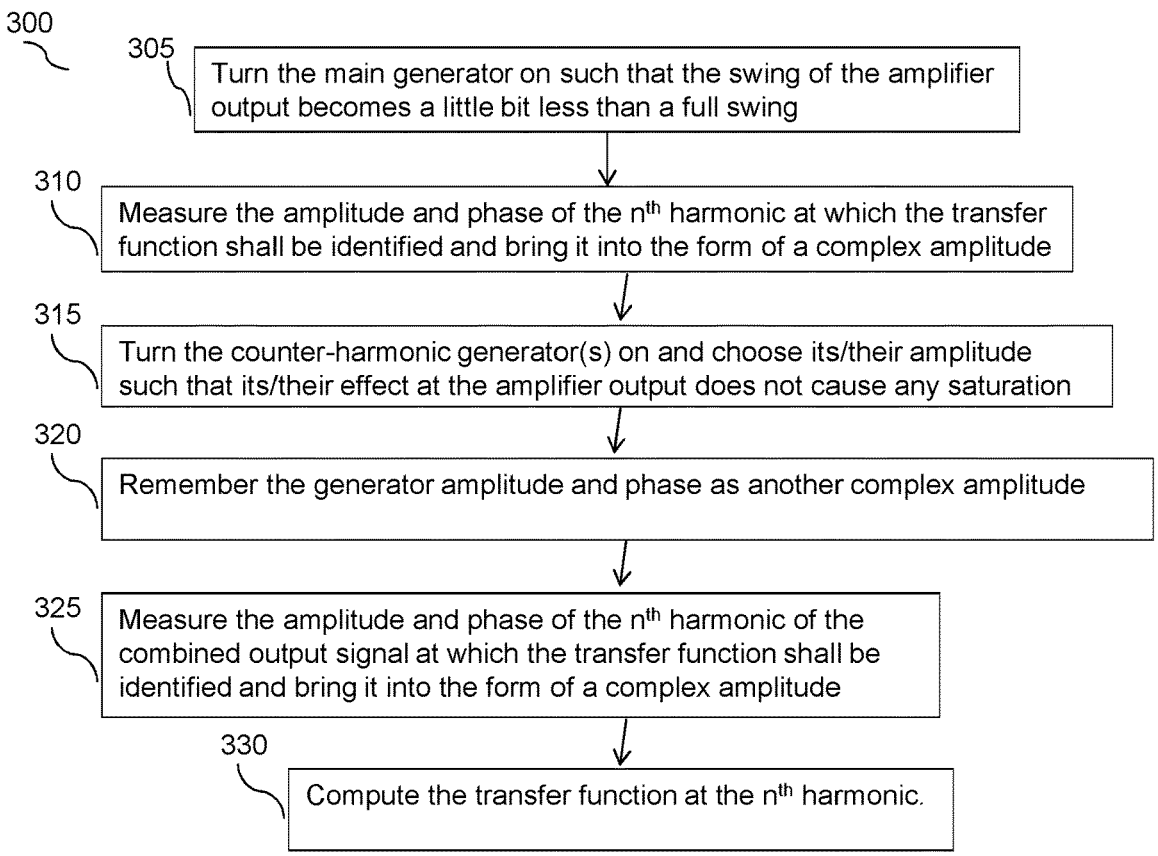
FIG. 3 illustrates a flowchart to calibrate a harmonic distortion generated by a wireless transmitter, such as a base station employed in a PKE system, according to example embodiments of the invention.

Examples of the present invention provide wireless transmitter, such as a base station for a PKE system, a circuit, and a method to reduce harmonic content therefor, which allow to reduce or cancel harmonic content (harmonic signals) that are generated by an amplifier in the transmitter by using a harmonic reduction (and to all intent and purpose preferably cancellation) technique. Although examples of the invention are described with reference to harmonic reduction in a base station for a PKE system, it is envisaged that the concepts described herein may be applicable to any wireless transmitter that generates a wireless signal in a transmission system for which low spurious harmonic emission is required.

The harmonic reduction in examples of the invention is applied in such a way that the harmonics produced by the amplifier, when amplifying the main transmission signal, are reduced. In examples of the invention, the harmonic reduction process creates harmonics of opposite phase and equal amplitude to the harmonics that will subsequently be generated by the non-ideal amplifier of the base station. In this manner, the introduction of the reducing/cancelling harmonics, for example introduced into an input signal input to a main signal generator signal, reduce the harmonics that would have been generated in the amplifier.

Advantageously, the level of the harmonic reduction signal(s) introduced to the main signal generator is at a low amplitude level. In some examples, a controller is arranged to determine a transfer function of the signal path between the input signal and the ultimate amplifier output signal, in order to ascertain the harmonic reduction signals to set for the generation of the harmonic reduction signals. In some examples, the inverse of the determined transfer function is applied to the amplifier output in order to compensate for (i.e. reduce or cancel) the harmonic signals that would have been generated.

In examples of the invention, a wireless transmitter, such as a PKE base station for a secure vehicle access system, is described. The wireless transmitter includes: a digital signal generator arranged to generate a digital signal for transmission; a digital-to-analog converter arranged to convert the digital signal for transmission into analog form; and a non-ideal amplifier arranged to amplify the analog signal for transmission. At least one harmonic reduction signal generator is arranged to generate at least one digital harmonic reduction signal; and a summing junction is arranged to add the digital signal for transmission with the at least one harmonic reduction signal to form a combined signal, wherein the non-ideal amplifier amplifies the combined signal to form an analog output signal. An analog to digital converter is arranged to convert the analog output signal into a digital representation of the analog output signal. A controller is coupled to the digital signal generator and the at least one harmonic reduction signal generator and arranged to: analyse the digital representation of the analog output signal to determine a harmonic content of the analog output signal; and cause the harmonic reduction signal generator to generate the at least one digital harmonic reduction signal such that it reduces at least one harmonic of the amplified analog signal for transmission output from the non-ideal amplifier.

In this manner, examples of the invention support a determination as to the level and frequency of one or multiple harmonics generated by a non-ideal amplifier of a wireless transmitter. A controller in the wireless transmitter then analyses this harmonic content information and causes counter harmonic signals to be generated and introduced into a main signal path, such that, once amplified, the counter harmonic signals reduce or cancel any harmonics that would have been generated by the non-ideal amplifier.

In some optional examples, the wireless transmitter may include a plurality of harmonic reduction signal generators arranged to generate a plurality of digital harmonic reduction signals, with each reduction signal generator used to target an individual signal harmonic of the analog output signal.

In some optional examples, the controller may be further configured to perform at least one of the following: determine how many harmonics are needed to be reduced; and instantiate that number of the at least one harmonic reduction signal generator(s). In this manner, a dynamic selection of harmonics may be targeted for reduction or cancellation.

In some optional examples, in a calibration mode of operation, the controller may be configured to: receive a representation of the analog output signal; determine a transfer function of the signal path between an output signal from the DAC and the representation of the analog output signal; and identify the harmonic reduction signals to set for the generation of the harmonic reduction signals. In this manner, the setting of various harmonic reduction signal generator(s) may be pre-calibrated, such that in normal operation the controller may be able to control the harmonic content of the output signal in a known, pre-calibrated and tested, way. In some examples, this may include the controller being further configured to apply calibration signals at an input of the non-ideal amplifier and determine a harmonic content of the output signal in response thereto.

In some optional examples, the controller may be further configured to use Discrete Fourier Analysis or the Discrete Fourier Transform to compute a complex amplitude of only the relevant harmonics determined as needed to be reduced. In this manner, a dynamic, selection of harmonics to be targeted for reduction can be adopted. In some optional examples, the controller may be configured to calibrate a harmonic response of the non-ideal amplifier by enabling the digital signal generator to generate a digital signal for transmission that approaches a full-swing of the non-ideal amplifier output signal. In this manner, a likelihood of performing the transfer function determination at an operating point of the non-ideal amplifier at which its distortion is concentrated (e.g. such as near any zero-crossing point) may be significantly reduced.

Because the illustrated embodiments of the present invention may, for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

Referring now to FIG. 2, an example block diagram of a wireless transmitter 200, such as a base station 205 for a passive keyless entry (PKE) system is illustrated, according to example embodiments of the invention. One aim of the circuit of FIG. 2 is to generate only a single sine wave, with significantly reduced levels of harmonic content. In examples of the invention, harmonic reduction may be achieved with moderate computational effort. In contrast to that, if the task were to find the correct harmonics and harmonic levels to reduce when amplifying a complex signal, such as for example an audio signal, it would require extremely high computation effort.

In this example, the wireless transmitter 200 includes base station 205 incorporates circuitry in both a digital domain 210 and an analog domain 260 coupled to an antenna 202 and other wireless circuits and components that are not shown for simplicity purposes only. The base station 205 includes an input signal 212 that is input to a signal (sine wave) generator 214. The digital signal (sine wave) generator 214 produces the basic shape of the carrier signal in a form of a digital output signal 222 that is, in accordance with examples of the invention, input into summing junction 230. In this example, the digital output signal 222 is a 125 KHz digital output signal 222. In other examples, the output signal may be any frequency and any output power level.

In accordance with example embodiments of the invention, the base station 205 includes one or more additional digital signal generators, in a form of a counter-harmonic circuit 216 that is also coupled to summing junction 230. The counter-harmonic circuit 216 includes one or more counter-harmonic generators 218, with two counter-harmonic generators 218 being illustrated in FIG. 2 for simplicity purposes only.

In some examples, one counter harmonic generator 218 is included per harmonic of interest (that is to be reduced or substantially cancelled). For example, in one example, five counter harmonic generators 218 may be employed, say, to reduce the odd harmonics of the ($f_c$=125 kHz) produced by the base station's (PKE driver) amplifier, which may fall into an amplitude modulation (AM) band; these are $5*f_c$=635 kHz, $7*f_c$=875 kHz, $9*f_c$=1.125 MHz, $11*f_c$=1.375 MHz, and $13*f_c$=1.625 MHz.

In this example, a controller 250 provides the input signal 212 to the digital signal (sine wave) generator 214, as well as separate counter harmonic input signals 211, 213 to the one or more counter-harmonic generators 218. The main task of the controller 250 is to provide for a time sequence of the desired amplitude levels, which may involve setting a constant carrier as well as performing amplitude modulation with an output envelope signal from a data sequencer and encoder (not shown).

In some examples, the controller 250 may perform a transfer function calibration process for the counter-harmonic reduction generators 218. The transfer function calibration is performed for the harmonics of interest, and the counter-harmonic reduction generators 218 may be activated sequentially or in parallel (but always together with the main generator 214 being on), and the analysis of the transfer functions may be done sequentially or in parallel. In this 'parallel calibration example, this is possible as harmonic signals of different frequencies are orthogonal and the non-ideal amplifier may be selected such that the intermodulation products of the harmonics themselves may be neglected.

When running the application, following a calibration process and where it is important to have the harmonics cancelled, the harmonic reduction generators 218 are configured to always operate in parallel with the amplitude and phase setting (using the input signals as provided by the controller 250) that have been computed during calibration.

Each of the counter-harmonic generators 218 outputs a respective digital harmonic reduction signal 220, 221 to the summing junction 230, where they are added to the digital output signal 222. In this example, each of the digital reduction signals 220, 221 is designed to be of a suitable amplitude, but of opposite phase (after amplification in the output of the non-ideal amplifier 264 and considering the transfer function of the DAC 262 and the non-ideal amplifier 264 itself), to a respective harmonic of the digital output signal 222. In this manner, each of the digital harmonic reduction signals 220, 221 substantially reduces or cancels the respective harmonic of the non-ideal amplifier's output signal 270. The output from the summing junction 230 is input to an amplitude control circuit 240, which facilitates setting the desired output (power) level of the signal to be input to the base station's amplifier. The amplitude circuit sets the desired output (power) level of the signal to be input to the base station's amplifier based on a control signal 242 provided by the controller 250. The digital signal to be amplified, i.e. the multiplied (modulated) 125 KHz digital output signal 222 together with the harmonic reduction signals from counter-harmonic circuit 216, are then output from amplitude control circuit 240 and input to a digital-to-analog converter (DAC) 262 to convert to an analog form within analog circuitry 260.

In this manner, the output from the summing junction 230 and the amplitude control circuit 240 carry the main signal (pure sine wave) and the one or more counter harmonic signal(s). Thus, these signals may appear distorted, but after processing by the DAC 262 and amplification, whereby all signals undergo the transfer function of these analog elements, the cancellation is optimal.

The DAC 262 outputs an analog version 263 of the multiplied (modulated) 125 KHz digital output signal 222, together with the harmonic reduction signals to a non-ideal amplifier 264. Thus, in accordance with examples of the invention, the amplified 125 KHz analog output signal 270 is substantially a pure sine wave output, with the harmonic content level of the output signal 270 being significantly reduced, as illustrated in FIG. 5.

Hence, the amplification of all input signals by the non-ideal amplifier 264, including the harmonic reduction signals, is such that once the harmonic reduction signals are amplified by the non-ideal amplifier 264, they are substantially of the exact same amplitude and opposite phase of the harmonics that are generated from the main signal, once amplified.

In this example, the amplitude control circuit 240 outputs, say, a 14-bit digital input signal that represents the main generator digital output signal 222 and each of the (low level) digital harmonic reduction signals 220, 221, whereby a single 14-bit DAC converts the digital sum of these input signals. In this example, the main generator 214 and counter-harmonic generators 218 produce their output signals autonomously, as the input signals are only control signals that control/set the necessary amplitude and phase of the signals to be generated. It is envisaged, as would be appreciated by a skilled artisan, that other topologies could be used as well to perform these amplification and DAC conversion operations.

In accordance with examples of the invention, a portion of the output signal 270 is input to an analog-to-digital converter (ADC) 266 that is configured to convert the (analog) output signal to a digital form and provide the digital representation of the output signal 268 to the controller 250.

In examples of the invention, the ADC 266 is selected or configured to avoid introducing any additional harmonics into the measured signal. This means that, in essence for harmonic suppression of 80 dB, a very low linearity error is required, for example better than $10^{-4}$. Since state-of-the-art ADCs may not inherently feature such low linearity errors, calibration techniques may be used in some envisaged applications, in order to correct the linearity to the required precision, for example employed by calibration controller 280. The results of any calibration process may be stored in memory 282. In this manner, the stored calibration data may be used to improve the linearity performance during normal operation. In one example of a calibration mode of operation, the calibration signals may be applied at the input of the non-ideal amplifier 264 during, say, a production test when the non-ideal amplifier 264 is in a tri-state.

In accordance with examples of the invention, the controller 250 is arranged to perform an analysis of the digital representation of the output signal 270 and, based thereon perform a transfer function (TF) identification of the signal change from the input signal 212 to the output signal 270. In this manner, the controller 250 may be able to determine the level of harmonics that are output from the non-ideal amplifier 264 and accordingly select suitable input signals 211, 213 to input to the one or more counter-harmonic generators 218 in order to ultimately generate harmonic reduction signals.

In accordance with examples of the invention, if the (driver) non-ideal amplifier 264 is built with enough symmetry, the unwanted distortion, which is added to the signal output of the non-ideal amplifier 264, will mainly contain odd harmonics, with frequencies $3f_0$, $5f_0$, $7f_0$, etc. With a carrier frequency of $f_0$=125 kHz (as a practical example) the odd harmonics that fall into the AM-band will range from $5f_O$ up to $13f_O$. Hence, in this example where the concepts herein described are used to reduce harmonic distortion into the AM frequency band range, only five harmonics are to be suppressed. Hence, five counter-harmonic (sine-wave) generators 218 are used and configured to operate on the odd-harmonic frequencies $5f_O$ through $13f_O$, respectively. In examples of the invention, each of these five counter-harmonic (sine-wave) generators 218 may be precisely controlled in both amplitude and phase by the controller 250 in such a way that the amplified result of the counter-harmonics generator circuit 216 reduces or substantially cancels its associated harmonic that result from amplifier distortion of the main signal by the non-ideal amplifier 264.

The main task of the controller 250 is to provide for a time sequence of the desired amplitude levels, which may involve setting a constant carrier as well as performing amplitude modulation with the output envelope signal from a data sequencer and encoder (not shown, but located within or coupled to the controller 250).

In order for the controller 250 to be able to compare the output signal 270 produced by the non-ideal (driver) amplifier 264 against a pure sinusoidal reference, it needs to be measured with sufficient precision. In this context, the sampling rate must be at least twice the frequency of the highest harmonic that is to be controlled (suppressed). Thus, if a noise margin (Nm) of $N_m$=6 dB is required for the smallest components to be measured, which are 80 dB below the carrier, it is possible to compute the required DAC resolution as a number of bits, as clarified below.

For example, from the calculation of the quantization noise of an ADC, the signal-to-noise ratio (SNR) of the signal to be reduced may be calculated as:

$$\text{SNR}=1.761 \text{ dB}+6.02 \text{ dB}*B \quad [1]$$

where B is the number of bits

Thus, when a 6 dB noise margin is required for a signal 80 dB below full scale, the SNR becomes:

$$\text{SNR}=1.761 \text{ dB}+6.02 \text{ dB}*B-80 \text{ dB}=6 \text{ dB} \quad [2]$$

Thereafter, the required number of bits may be calculated as in [3]:

$$B = \left\lceil \frac{6 \text{ dB} + 80 \text{ dB} - 1.761 \text{ dB}}{6.02 \text{ dB}} \right\rceil = \lceil 13.99 \rceil \text{bits} = 14 \text{ bits} \quad [3]$$

Thus, in examples, of the invention an error margin is included in the calculation. Furthermore, in some example embodiments, it may be possible to partially filter away a significant portion of the main carrier signal, which could suppress the fundamental wave by, say, 20 dB to 30 dB. In such a case, a fewer number of bits (e.g. a reduction of 3-5 bits) is required to achieve the same SNR with the same noise margin requirement. In this example, a lower resolution ADC (e.g. a 9-11 bit ADC) may be employed, thereby making the implementation much more feasible and cost effective.

As the circuit and the proposed harmonic reduction method is not dependent on the amplifier type or frequency of operation, the proposed circuit architecture can adapt to a variety of operational conditions, e.g. adapt to circuit or amplifier temperature, supply voltage, antenna detuning (e.g. general changes in the load), ageing, etc. Advantageously, the proposed method is capable of bringing the total harmonic distortion from 1% down to <0.01%, which is a 40 dB improvement. Furthermore, this improvement may be achieved at relatively low frequencies, such as at 125 kHz, where the known distortion reduction methods are very difficult to implement.

In some examples, aliasing phenomena will completely disappear if the sampling rate is maintained at an exact integer multiple of the carrier frequency $f_O$. In this scenario, no windowing (e.g. a Hanning Window) needs to be applied.

In some examples, it may also be preferable to let the sampling rate be a power-of-2 multiple of the carrier frequency $f_O$. In this scenario, fast fourier transforms (FFT) may be easily and readily employed, without windowing, which can be advantageous for in-depth signal analysis and for debugging of the system.

In practice, the analog path that includes the DAC 262, the non-ideal amplifier 264 and the ADC 266, exhibits a frequency response that must be calibrated, at least at the harmonic frequencies at which reduction or cancellation shall be performed. Thus, in some example embodiments, a transfer function of this response is determined by the controller 250.

In some examples of the invention, the controller 250 determines the transfer function of this response by ensuring that a calibration signal causes a generation of a main signal at nearly full swing, with the effect of this 'nearly full swing' signal being measured by the controller 250. With this approach, the likelihood of performing the transfer function determination at an operating point of the non-ideal amplifier 264 at which its distortion is concentrated (e.g. such as near any zero-crossing point) is significantly reduced.

This approach is in contrast to the theoretical approach to turn on only one of the counter-harmonics generators 218 with a known amplitude and phase, and thereafter measure the amplitude and phase of the signal produced by the non-ideal amplifier 264 at the input to the ADC 266. Although theoretically possible to determine the transfer function of this response in this manner, the distortion of the non-ideal amplifier 264 may adulterate the measurement result too much. For example, if the non-ideal amplifier 264 has a zero-crossing problem (either due to jumps or a dead zone) the gain of the non-ideal amplifier 264 when handling small signals, may be mis-calculated. Using a large signal amplitude for the identification is also not an option, because at frequencies higher than the intended operating frequency, the non-ideal amplifier 264 may suffer from additional large-signal distortions.

In examples of the invention, the controller 250 is configured to both determine a transfer function of the analog components of the base station 205, as well as perform an analysis of the output signal of the non-ideal amplifier 264 to initiate a harmonics suppression algorithm. In both, the identification of the transfer function as well as in the harmonics suppression algorithm, the complex discrete spectrum of the amplifier output, referred to as 'counter harmonics parametrization', is measured by the controller 250. In examples of the invention, this measurement to determine the needed amplitude and phase of each counter harmonic generator signal, may be performed by the controller 250 using Discrete Fourier Analysis (which differs from a Discrete Fourier Transform only by a factor that is equal to a number of points in the time series). In this manner, use of Discrete Fourier Analysis may be much less computationally-intensive, as only a few spectral lines (at $n*f_O$, with $n \in \{5, 7, 9, 11, 13\}$ in this example) are needed. Thus, a use of Discrete Fourier Analysis (or a Discrete Fourier Transform) may be advantageously used to compute the complex amplitude of only the relevant harmonics, instead of employing any FFT algorithm that computes all harmonics.

When performing the proposed algorithms there is no interest in the spectral content between these discrete lines. In some debugging or demonstration applications, the proposed 'counter harmonics parametrization' measurements may be obtained by computing the full spectra, in which case using the radix-2 FFT may be preferable.

Referring now to FIG. 3, a flowchart 300 illustrates an example method to calibrate a distortion generated by a wireless transmitter, such as a base station employed in a PKE system, according to example embodiments of the invention. In this example, the flowchart 300 is performed for each harmonic frequency $n \cdot f_0$ at which the transfer function shall be identified. At 305, the main generator is turned on, such that the swing of the amplifier output becomes a little bit less than a full swing. In some examples, this amplifier swing may be of the order of 90% of the full swing. At 310, Measure the amplitude and phase of the $n^{th}$ harmonic at which the transfer function shall be identified and bring it into the form of a complex amplitude:

$$\underline{A}_{n,off} = A_{n,off} \cdot e^{j\varphi_{n,off}} \quad [2]$$

At 315, the counter-harmonic generator is also turned on and a suitable amplitude chosen such that its effect at the amplifier output does not cause any saturation. In some examples, this suitable amplitude of the counter-harmonic generator may elicit an amplifier swing of the order of 5 to 10% of the full amplifier output swing. At 320, the counter-harmonic generator amplitude and phase are stored as another complex amplitude, as indicated in [5] below:

$$\underline{A}_{n,gen} = A_{n,gen} \cdot e^{j\varphi_{n,gen}} \quad [5]$$

At 325, the amplitude and phase of the $n^{th}$ harmonic of the combined output signal, at which the transfer function shall be identified, is measured and this value also brought into the form of a complex amplitude, as indicated in [6] below:

$$\underline{A}_{n,on} = A_{n,on} \cdot e^{j\varphi_{n,on}} \quad [6]$$

At 330, the transfer function is computed at the $n^{th}$ harmonic as:

$$H(n, f_0) = \frac{\underline{A}_{n,on} - \underline{A}_{n,off}}{\underline{A}_{n,gen}} \quad [7]$$

In an alternative example of the flowchart 300, it is envisaged that several counter-harmonic generators may be turned on simultaneously at 315. In this alternative example, step 315 is carefully controlled to ensure that the amplitude of the signal sum of the multiple counter-harmonics generator amplitudes does not bring the amplifier into saturation. In some examples, this may significantly reduce the number of identification tests, and thereby speed up the harmonic identification process.

Figure 4:
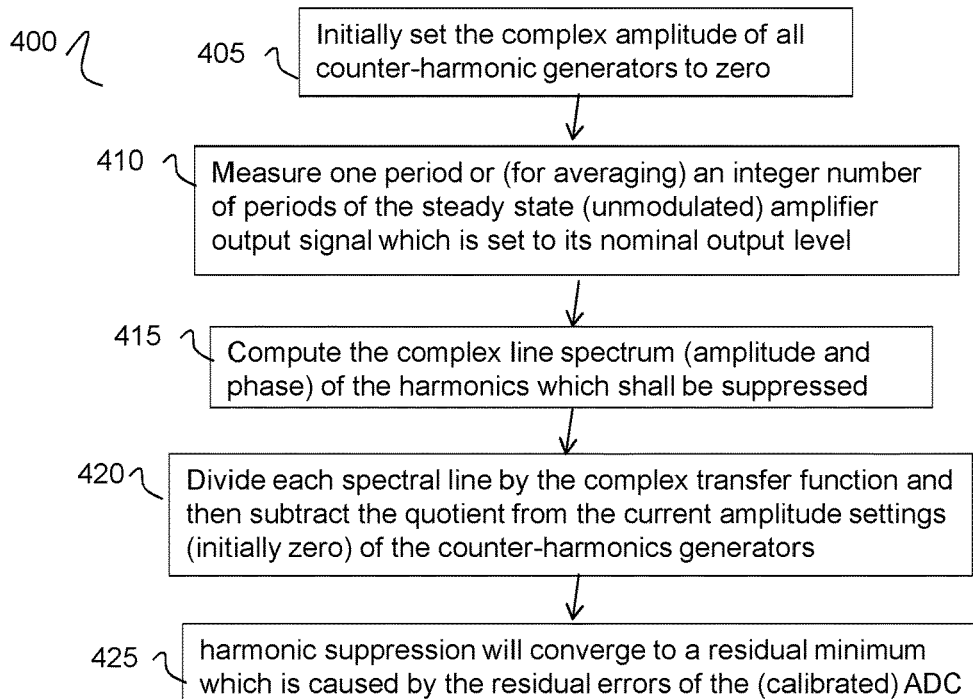
FIG. 4 illustrates a flowchart of an example harmonic reduction process for a wireless transmitter, such as a base station employed in a PKE system, according to example embodiments of the invention.

Referring now to FIG. 4, a flowchart 400 illustrates an example harmonic reduction process for a wireless transmitter, such as a base station employed in a PKE system, according to example embodiments of the invention. At 405, the complex amplitude of all counter-harmonic generators is initially set to zero. Subsequently at 410, and then from time to time, one period (or an integer number of periods for averaging purposes) is measured of the steady state (unmodulated) amplifier output signal, when it is set to its nominal output level. At 415, the complex line spectrum (amplitude and phase) of the harmonics that shall be suppressed is computed, as indicated in [8] below:

$$\underline{A}_{n,output} = A_{n,output} \cdot e^{j\varphi_{n,output}} \quad [8]$$

At 420, each spectral line is divided by the complex transfer function and then the quotient is subtracted from the current amplitude settings (that are initially set to zero) of the counter-harmonics generators:

$$\underline{A}_{n,counter\_harmonic} = \underline{A}_{n,counter\_harmonic} - \frac{\underline{A}_{n,output}}{H(n, f_0)} \quad [9]$$

Even if the result of the identification is not perfect, the harmonic suppression will converge to a residual minimum that is caused by the residual errors of the calibrated ADC at 425. This is because the calibration and harmonic system can 'see' only the measurement sequence from the ADC output, and therefore it has to believe that this is a 'true reflection' of the output of the non-ideal amplifier 264. All harmonics at the output of the ADC 425 will be perfectly cancelled. Hence, the goal of the control loop is actually to make the ADC output a pure sine wave. But if the ADC output does not reflect the amplifier output, the ADC output will be a pure sine wave but the amplifier output will be distorted by the negative distortion of the ADC. In this example, the errors of the DAC and the errors of the amplifier, and indeed all analog parts of the loop, are indistinguishable. In essence, the errors do not need to be distinguished as the harmonic reduction process compensates all errors in total, regardless of where they emanate from.

FIG. 5 illustrates two example sequences of spectra for a typical application, a first spectral sequence of the distortion spectra performance 500 of a known wireless transmitter, such as a base station and a second spectral sequence of distortion spectra performance 550 for a wireless transmitter, such as a base station adapted according to example embodiments of the invention. In the two example sequences of spectra for a typical application, the spectral content 520 is illustrated for harmonics '1' to '9', with the level of harmonic content indicated in dB relative to the main carrier signal 530.

The first spectral sequence of the distortion spectra performance 500 includes a total harmonic distortion (THD) content for harmonics '1' to '9' of 0.6123%, corresponding to −44.26 dB and predominantly due to the second harmonic content 540. In contrast, once the example harmonic reduction is performed in accordance with examples of the invention, for example following the operation identified in FIG. 4, the THD content for harmonics '1' to '9' reduces to 0.02122%, corresponding to −73.47 dB, but this time predominantly due to the third harmonic content 560 due to the significant reduction in the second harmonic content 550.

The harmonic reduction signals 220, 221 purely a digital representation of the opposite phase of the outputs of the non-ideal amplifier divided by the transfer function of the DAC and the non-ideal amplifier 264.

In some examples, and in order to avoid any harmonics of the harmonic reducing signals being problematic, it is important that the non-ideal amplifier 264 has an inherently low distortion (say THD<1%). Also, it is useful, for a given output amplitude, that the non-ideal amplifier 264 is configured to sweep its output through different regions of the non-ideal amplifier's distorted characteristic curve from −excursion peak to +excursion peak. As a consequence of these factors, it can be assumed that whatever signals are provided to the amplifier's input, they undergo the transfer function at the input's frequency, and then 99% of that result appears at the output. Due to the distortion of the amplifier it can also produce, at most, 1% higher harmonics. Thus, the example embodiments described herein provide at least 99% control over each harmonic to be cancelled. Therefore, for 1% initial THD we can improve the harmonics only by about 40 dB with one application of the algorithm. It is envisaged in some examples that the harmonic reduction algorithm may be run several times, which has resulted in tests that show less than −100 dB THD.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, in some example scenarios, the whole digital circuitry of FIG. 2 may be implemented in a digital signal processor (DSP).

In some examples, the concepts herein described may be implemented in a DSP solution or generally a software solution, where harmonic reduction generators are dynamically instantiated as needed (e.g. in different applications or app's or, for example, when the surrounding conditions change, e.g. when a wireless transmitter moves from one country to another).

In this example implementation, each generator (counter harmonic generator(s) 218 and main generator 214 may receive DSP instructions to generate their respective signals. In alternative embodiments, the whole of (or a portion of) the digital circuitry may be implemented as a collection of components and/or circuits and/or logic gates.

Alternatively, the circuit and/or component examples may be implemented as any number of separate integrated circuits or separate devices interconnected with each other in a suitable manner.

Also for example, the examples, or portions thereof, may implemented as software or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired sampling error and compensation by operating in accordance with suitable program code, such as minicomputers, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one, or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A wireless transmitter comprising:
   a digital signal generator configured to generate a digital signal for transmission;
   a summing junction configured to add the digital signal with a plurality of digital harmonic reduction signals to form a combined signal;
   a digital-to-analog converter configured to convert the combined signal into an analog signal;

a non-ideal amplifier configured to amplify the analog signal for transmission as an analog output signal;

an analog to digital converter configured to convert the analog output signal into a digital representation of the analog output signal; and a controller coupled to a plurality of harmonic reduction signal generators, the controller configured to:

analyze the digital representation of the analog output signal to measure an amplitude and a phase for each harmonic of the analog output signal;

determine how many harmonics are needed to be reduced;

instantiate that number of harmonic reduction signal generators; and cause each instantiated harmonic reduction signal generator to generate a respective digital harmonic reduction signal, wherein each digital harmonic reduction signal has substantially the same amplitude as the measured amplitude and an opposite phase to the measured phase of a respective harmonic in the digital signal.

2. The wireless transmitter of claim 1, wherein the controller is configured to enable the plurality of harmonic reduction signal generators to generate the digital harmonic reduction signals, with each harmonic reduction signal generator used to target an individual signal harmonic of the analog output signal.

3. The wireless transmitter of claim 1, wherein the controller is configured to, in a calibration mode:

receive a representation of the analog output signal;

determine a transfer function of the signal path between the analog signal from the DAC and the representation of the analog output signal; and identify the harmonic reduction signals to set for the generation of the harmonic reduction signals.

4. The wireless transmitter of claim 3, wherein the controller is further configured to:

use Discrete Fourier Analysis or the Discrete Fourier Transform to compute a complex amplitude of only the relevant harmonics determined as needed to be reduced.

5. The wireless transmitter of claim 3, wherein the controller is further configured to:

apply calibration signals at an input of the non-ideal amplifier, and determine a harmonic content of the analog output signal in response thereto.

6. The wireless transmitter of claim 3, wherein the controller is configured to calibrate a harmonic response of the non-ideal amplifier by enabling the digital signal generator to generate a digital signal for transmission that approaches a full-swing of the analog output signal.

7. The wireless transmitter of claim 3, wherein the controller is configured to compare the digital representation of the analog output signal against a sinusoidal reference using a sampling rate that is a power-of-2 multiple of the carrier frequency $f_0$.

8. The wireless transmitter of claim 1, wherein the controller is configured to:

analyze the digital representation of the analog output signal to determine a variation in harmonic content of the analog output signal over time, and dynamically configure the generation of the digital harmonic reduction signals in response to the variation in harmonic content.

9. The wireless transmitter of claim 1, wherein the wireless transmitter is a base station for a secure vehicle access system.

10. A circuit comprising:

a digital signal generator configured to generate a digital signal for transmission;

a summing junction configured to add the digital signal with a plurality of digital harmonic reduction signals to form a combined signal;

a digital-to-analog converter configured to convert the combined signal for transmission into an analog signal;

a non-ideal amplifier configured to amplify the analog signal for transmission as an analog output signal;

an analog to digital converter, configured to convert the analog output signal into a digital representation of the analog output signal; and a controller coupled to a plurality of harmonic reduction signal generators and configured to:

analyze the digital representation of the analog output signal to measure an amplitude and a phase for each harmonic of the analog output signal;

determine how many harmonics are needed to be reduced;

instantiate that number of harmonic reduction signal generators; and cause each instantiated harmonic reduction signal generator to generate a respective digital harmonic reduction signal, wherein each digital harmonic reduction signal has substantially the same amplitude as the measured amplitude and an opposite phase to the measured phase of a respective harmonic in the digital signal.

11. A method for harmonic reduction in a wireless transmitter, the method comprising:

generating a digital signal for transmission;

adding the digital signal with a plurality of digital harmonic reduction signals to form a combined signal;

converting the combined signal into an analog signal;

amplifying the analog signal by a non-ideal amplifier into an analog output signal;

converting the analog output signal into a digital representation of the analog output signal;

analyzing the digital representation of the analog output signal to measure an amplitude and a phase for each harmonic of the analog output signal;

determining how many harmonics are needed to be reduced;

instantiating that number of harmonic reduction signal generators; and causing each instantiated harmonic reduction signal generator to generate a respective digital harmonic reduction signal, wherein each digital harmonic reduction signal has substantially the same amplitude as the measured amplitude and an opposite phase to the measured phase of a respective harmonic in the digital signal.

12. The method of claim 11, further comprising, performing initially, in a calibration mode of operation:

applying at least one calibration signal at an input of the non-ideal amplifier; and determining a harmonic content of the analog output signal of the non-ideal amplifier in response thereto.

13. A wireless transmitter comprising:

a digital signal generator configured to generate a digital signal for transmission;

a summing junction configured to add the digital signal with a plurality of digital harmonic reduction signals to form a combined signal;

a digital-to-analog converter configured to convert the combined signal into an analog signal;

a non-ideal amplifier configured to amplify the analog signal for transmission as an analog output signal;

an analog to digital converter configured to convert the analog output signal into a digital representation of the analog output signal; and a controller coupled to a plurality of harmonic reduction signal generators, the controller configured to:

analyze the digital representation of the analog output signal to measure an amplitude and a phase for each harmonic of the analog output signal;

cause each harmonic reduction signal generator to generate a respective digital harmonic reduction signal, wherein each digital harmonic reduction signal has substantially the same amplitude as the measured amplitude and an opposite phase to the measured phase of a respective harmonic in the digital signal;

receive, in a calibration mode, a representation of the analog output signal;

determine, in the calibration mode, a transfer function of the signal path between the analog signal from the DAC and the representation of the analog output signal;

identify, in the calibration mode, the harmonic reduction signals to set for the generation of the harmonic reduction signals compute a complex line spectrum of amplitude and phase of the harmonics to be suppressed;

divide each spectral line by a complex transfer function to produce a quotient; and subtract the quotient from current amplitude settings of the plurality of harmonic reduction signal generators.

* * * * *